(12) United States Patent
Perlmutter et al.

(10) Patent No.: US 11,334,481 B2
(45) Date of Patent: *May 17, 2022

(54) STAGGERED GARBAGE COLLECTION UNIT (GCU) ALLOCATION ACROSS DIES

(71) Applicant: Seagate Technology LLC, Fremont, CA (US)

(72) Inventors: Stephen H. Perlmutter, Louisville, CO (US); Stacey Secatch, Niwot, CO (US); Andrew Louder, Longmont, CA (US)

(73) Assignee: SEAGATE TECHNOLOGY LLC

( * ) Notice: Subject to any disclaimer, the term of this patent is extended or adjusted under 35 U.S.C. 154(b) by 0 days.

This patent is subject to a terminal disclaimer.

(21) Appl. No.: 16/947,804

(22) Filed: Aug. 18, 2020

(65) Prior Publication Data

US 2020/0379903 A1 Dec. 3, 2020

Related U.S. Application Data

(63) Continuation of application No. 16/022,822, filed on Jun. 29, 2018, now Pat. No. 10,747,662.

(51) Int. Cl.
| | |
|---|---|
| *G11C 5/06* | (2006.01) |
| *G06F 3/06* | (2006.01) |
| *G06F 11/10* | (2006.01) |
| *G06F 12/02* | (2006.01) |

(52) U.S. Cl.
CPC ........ *G06F 12/0253* (2013.01); *G06F 3/0608* (2013.01); *G06F 3/0631* (2013.01); *G06F 3/0688* (2013.01); *G06F 11/1068* (2013.01); *G11C 5/06* (2013.01); *G06F 2212/7201* (2013.01); *G06F 2212/7205* (2013.01)

(58) Field of Classification Search
CPC .. G06F 12/0253; G06F 3/0608; G06F 3/0631; G06F 3/0688; G06F 11/1068; G06F 2212/7201; G06F 2212/7205; G06F 2212/1044; G06F 3/064; G06F 11/1012; G06F 12/0246; G06F 3/0679; G11C 5/06
See application file for complete search history.

(56) References Cited

U.S. PATENT DOCUMENTS

| | | |
|---|---|---|
| 8,417,904 B2 | 4/2013 | Goss et al. |
| 8,898,373 B1 | 11/2014 | Kang et al. |
| 9,606,915 B2 | 3/2017 | Horspool et al. |
| 10,140,215 B1 | 11/2018 | Canepa et al. |
| 10,552,086 B2 | 2/2020 | Calude et al. |
| 2011/0055455 A1 | 3/2011 | Post et al. |
| 2015/0347025 A1 | 12/2015 | Law |
| 2018/0067881 A1 | 3/2018 | Frandzel et al. |
| 2018/0095675 A1 | 4/2018 | Kachare et al. |
| 2018/0101494 A1 | 4/2018 | Davis et al. |

*Primary Examiner* — Jorge A Casanova
(74) *Attorney, Agent, or Firm* — Hall Estill Law Firm

(57) ABSTRACT

Apparatus and method for managing a non-volatile memory (NVM) such as a flash memory in a solid-state drive (SSD). In some embodiments, the NVM is arranged as a plurality of semiconductor memory dies coupled to a controller circuit using a plurality of channels. The controller circuit divides the plurality of dies into a succession of garbage collection units (GCUs). Each GCU is independently erasable and allocatable for storage of user data. The GCUs are staggered so that each GCU is formed from a different subset of the dies in the NVM. In further embodiments, the dies are arranged into NVM sets in accordance with the NVMe (Non-Volatile Memory Express) specification with each NVM set addressable by a different user for storage of data in a separate set of staggered GCUs.

20 Claims, 6 Drawing Sheets

STAGGERED GARBAGE COLLECTION UNIT (GCU) ALLOCATION ACROSS DIES

RELATED APPLICATION

The present application is a continuation of U.S. patent application Ser. No. 16/022,822 filed Jun. 29, 2018, which issues as U.S. Pat. No. 10,747,662 on Aug. 18, 2020.

SUMMARY

Various embodiments of the present disclosure are generally directed to the storage of data in a non-volatile memory (NVM), such as a flash memory in a solid-state drive (SSD).

In accordance with some embodiments, the NVM is arranged as a plurality of semiconductor memory dies coupled to a controller circuit using a plurality of channels. The controller circuit divides the plurality of dies into a succession of garbage collection units (GCUs). Each GCU is independently erasable and allocatable for storage of user data. The GCUs are staggered so that each GCU is formed from a different subset of the dies in the NVM. In further embodiments, the dies are arranged into NVM sets in accordance with the NVMe (Non-Volatile Memory Express) specification with each NVM set addressable by a different user for storage of data in a separate set of staggered GCUs.

These and other features which may characterize various embodiments can be understood in view of the following detailed discussion and the accompanying drawings.

DETAILED DESCRIPTION

Figure 1:
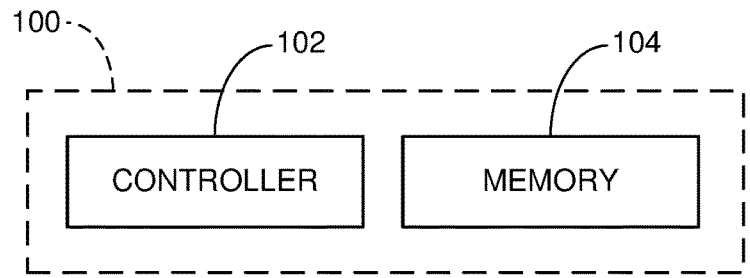
FIG. 1 provides a functional block representation of a data storage device in accordance with various embodiments.

Solid state drives (SSDs) are data storage devices that store user data in non-volatile memory (NVM) made up of an array of solid-state semiconductor memory cells. SSDs usually have an NVM module and a controller. The controller directs the transfer of user data between the NVM and a host device. The NVM will usually be NAND flash memory, but other forms of solid-state memory can be used.

NAND flash memory is usually arranged as a number of semiconductor memory dies. The dies are operably connected to a controller circuit using a sequence of channels (lanes). Usually, multiple dies are connected to each channel, such as 16 dies per channel, etc. The dies are subdivided into smaller physical and logical units such as planes, garbage collection units, erasure blocks, pages, memory cells, etc.

Erasure blocks represent the smallest grouping of flash memory cells that can be erased at a time. Garbage collection operations are carried out as background routines to periodically recycle the erasure blocks for reuse. A garbage collection operation generally includes searching the erasure block(s) for current version data, rewriting the current version data to a new location, and then applying an erasure operation to reset the memory cells. Erasure blocks are usually grouped into larger garbage collection units (GCUs) that incorporate one or more erasure blocks from different dies and which can be erased and allocated as a unit.

Some SSDs and other forms of data storage devices are configured in accordance with the NVMe (Non-Volatile Memory Express) specification, which enables multiple users to access the storage device using one or more PCIe (Peripheral Component Interface Express) interfaces. The NVMe specification allows an NVM to be subdivided into a number of NVM sets, with each set providing a separate and independent memory for storage of user data by an associated user. In an SSD, the NVM sets may be arranged as die sets, so that different selected groups of dies are dedicated to different users. It is generally desirable to maintain deterministic (e.g., predictable) levels of I/O performance for each of the sets. A problem can arise when multiple users are concurrently accessing the respective die sets. Depending on the relative arrangement of dies, channels and GCUs, significant variations in effective I/O transfer rates can be observed.

Various embodiments of the present disclosure are generally directed to an apparatus and method for managing data transfers in a non-volatile memory (NVM), such as but not limited to a flash memory in a solid-state drive (SSD). As explained below, some embodiments provide an NVM with a population of semiconductor memory dies across which garbage collection units (GCUs) are formed. In some cases, the dies may be divided into some number of NVM sets for the storage of user data by different owners in accordance with the so-called NVMe (Non-Volatile Memory Express) specification.

Within each die set, the GCUs are staggered such that different GCUs encompass memory units (e.g., erasure blocks) from different combinations of dies. Generally, the GCUs are selected such that, within each die set, nominally each die will contribute to the same ratio of the GCUs. In this way, access operations will tend to provide consistent data I/O transfer rate performance.

Without limitation, in some embodiments each die is provided with multiple planes, and each GCU that includes a given die uses a single erasure block from each plane on that die. Parity data sets can be written to provide error protection capabilities. The scheme facilitates more consistent transfer rate performance, better wear leveling and adjustments in the overall sizes of the GCUs in response to die failures or other conditions.

These and other features and advantages of various embodiments can be understood beginning with a review of FIG. 1 which provides a functional block diagram of a data storage device 100. The device 100 has a controller 102 and a memory module 104.

The controller block 102 represents a hardware based and/or programmable processor based circuit configured to provide top level communication and control functions. The memory module 104 includes solid state non-volatile memory (NVM) for the storage of user data from a host device.

Figure 2:
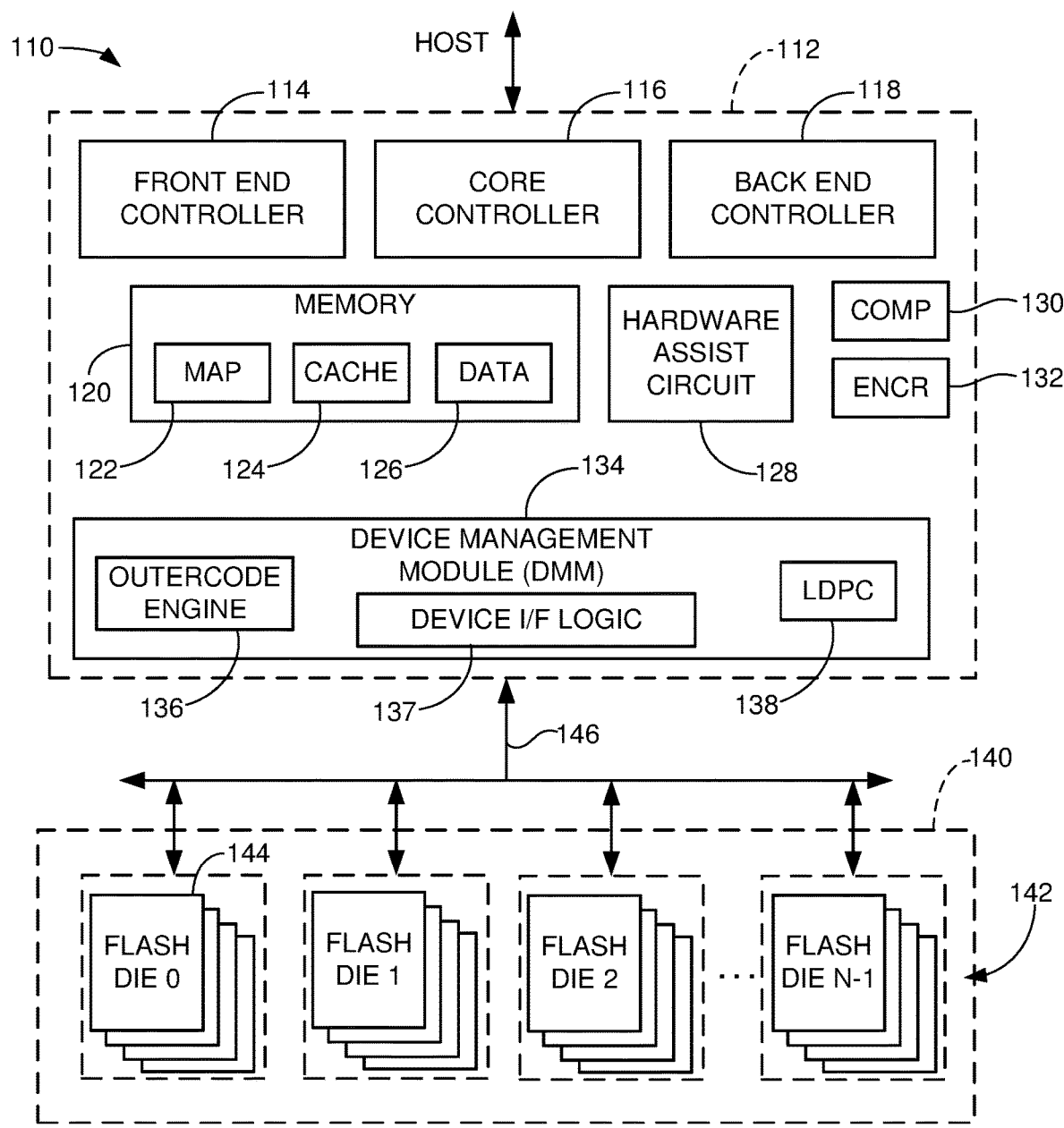
FIG. 2 shows aspects of the device of FIG. 1 characterized as a solid state drive (SSD) in accordance with some embodiments.

FIG. 2 shows a data storage device 110 as a particular embodiment of the device 100 in FIG. 1. The device 110 is configured as a solid state drive (SSD) that communicates with one or more host devices via one or more Peripheral Component Interface Express (Pete) ports. The NVM is contemplated as comprising NAND flash memory, although other forms of solid state non-volatile memory can be used.

In at least some embodiments, the SSD operates in accordance with the NVMe (Non-Volatile Memory Express) Standard, which enables different users to allocate NVM sets (die sets) for use in the storage of data. Each NVM set may form a portion of an NVMe namespace that may span multiple SSDs or be contained within a single SSD.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can alternatively be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via a number of channels (lanes) 146.

Figure 3:
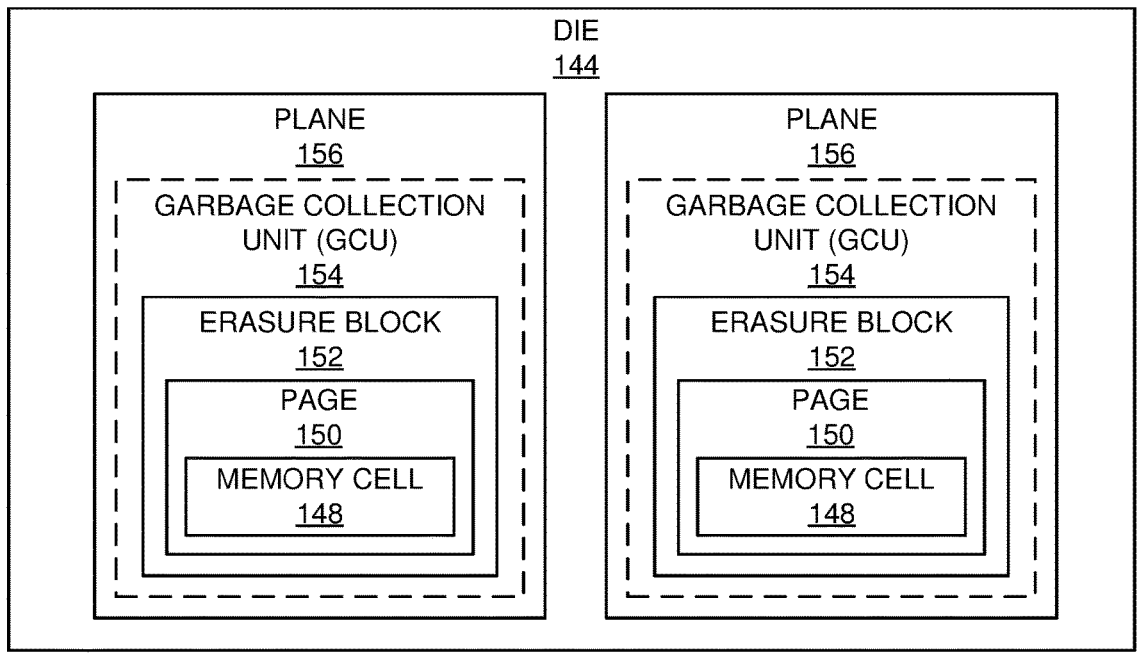
FIG. 3 shows an arrangement of the flash memory of FIG. 2 in some embodiments.

FIG. 3 shows a physical/logical arrangement of the various flash memory dies 144 in the flash memory 142 of FIG. 2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), XLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location, followed by an erasure operation to reset the memory cells to an erased (unprogrammed) state. The recycled GCU is returned to an allocation pool for subsequent allocation to begin storing new user data. In some embodiment, each GCU 154 nominally uses one or more erasure blocks 152 from each of a plurality of dies 144.

Each die 144 may further be organized as a plurality of planes 156. Examples include two planes per die as shown in FIG. 3, although other numbers of planes per die, such as four planes per die, etc. can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
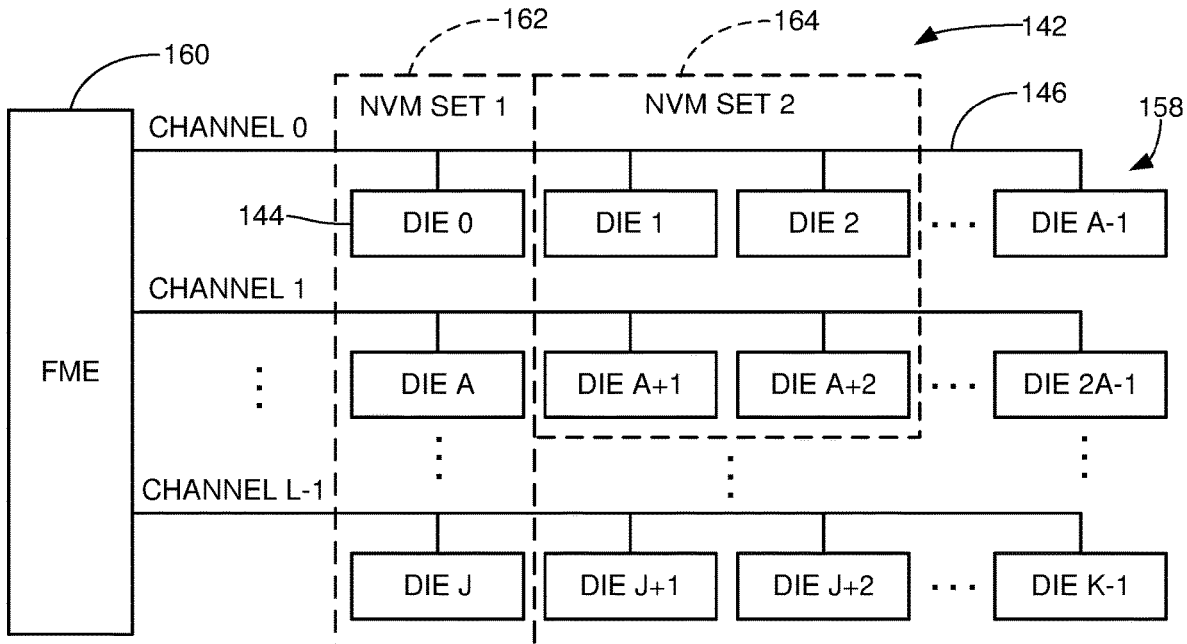
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. Flash memory electronics (FME) circuitry 160 of the flash memory module 142 controls each of the channels 146 to transfer data to and from the respective die groups 158. In one example, K is set to 128 dies, L is set to 8 channels, and each physical die group has 16 dies. In this way, any of the 16 dies physically connected to a given channel 146 can be accessed at a given time using the associated channel. Generally, only one die per channel can be accessed at a time.

In some embodiments, the various dies are arranged into one or more NVM sets. An NVM set, also referred to a die set, represents a portion of the storage capacity of the SSD that is allocated for use by a particular host (user/owner). NVM sets are established with a granularity at the die level, so that each NVM (die) set will encompass a selected number of the available dies 144.

A first example NVM set is denoted at 162 in FIG. 4. This first set 162 uses a single die 144 from each of the different channels 146. This arrangement provides fast performance during the servicing of data transfer commands for the set since all eight channels 146 are used to transfer the associated data to service a host access command. A limitation with this approach is that if the set 162 is being serviced, no other NVM sets can be serviced during that time interval. While the set 162 only uses a single die from each channel, the set could also be configured to use multiple dies from each channel, such as four (4) dies per channel for a total of 32 dies.

A second example NVM set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple NVM sets at the same time, provided the sets do not share the same (e.g., an overlapping) channel 146.

Figure 5:
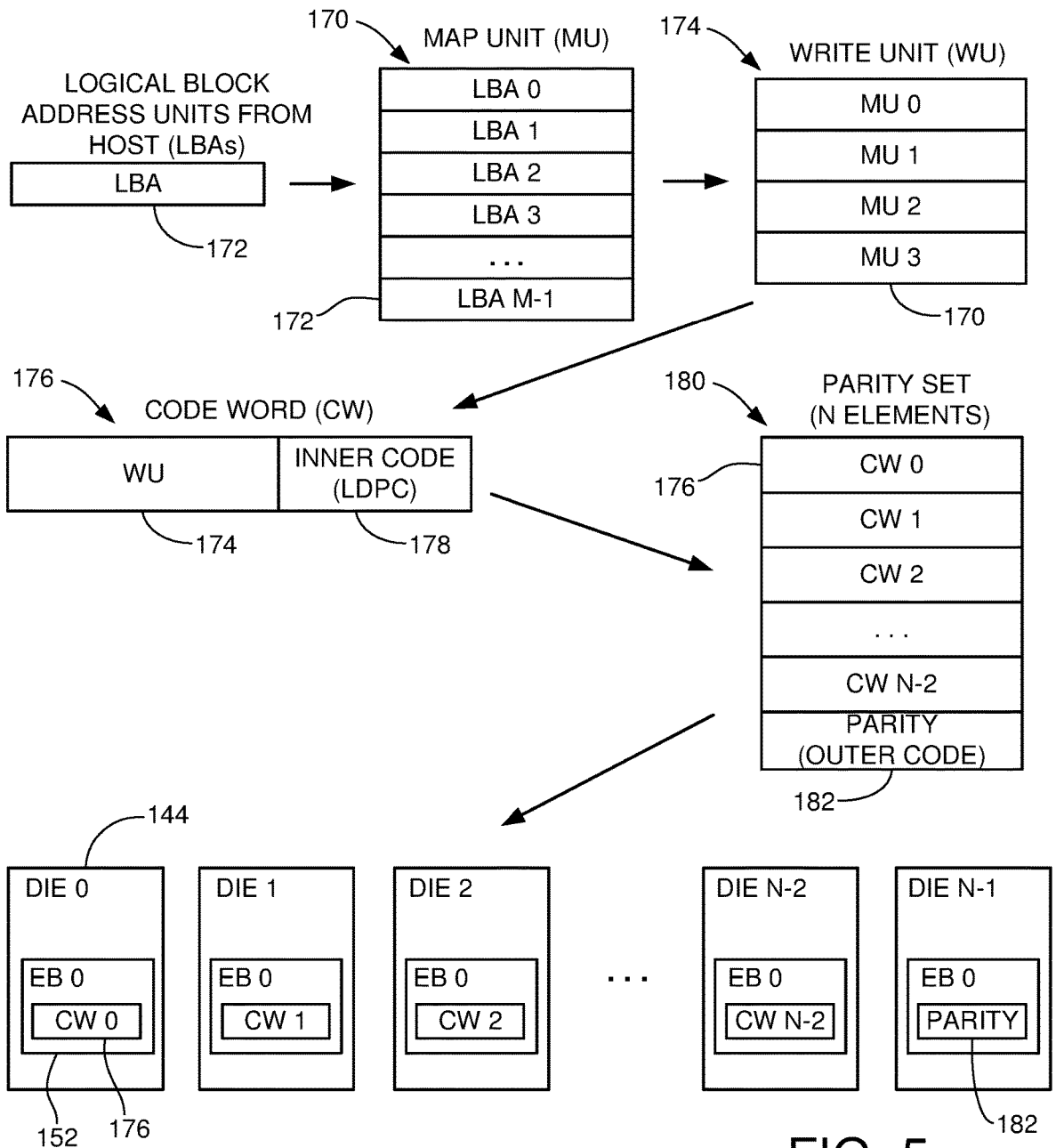
FIG. 5 illustrates a map unit (MU) as a data arrangement stored to the flash memory of FIG. 2.

FIG. 5 illustrates a manner in which user data are stored to the flash memory module 142 in accordance with some embodiments. Map units (MUs) 170 represent fixed sized blocks of data that are made up of one or more user logical block address units (LBAs) 172 supplied by the host. Without limitation, the LBAs 172 may have a first nominal size, such as 512 bytes (B), 1024 B (1 KB), etc., and the MUs 170 may have a second nominal size, such as 4096 B (4 KB), etc. The application of data compression may cause each MU to have a smaller size in terms of actual bits written to the flash memory 142.

As noted above, in one example each page 150 represents nominally 16 KB of user data capacity. Hence, each set of four (4) MUs 170 will be grouped together to form a write units (WU) 174 of nominally 16 KB of user data.

A code word (CW) 176 is formed by appending, to the WU 174, an inner code value 178. It is contemplated that the inner code constitutes low density parity check (LDPC) codes, although other error correction schemes can be used. The number of code bits will vary, but may be on the order of about 10 KB or so for 16 KB of user data, depending on the construction of the flash memory 142. As will be recognized, LDPC codes enable fast detection and correction of read errors during a read operation. The inner codes 178 may be generated by the LDPC module 138 (see FIG. 2) in preparation of writing of the WU 174 to the flash memory.

Some number of code words 176 are grouped together to form a parity set 180 having N elements. Nominally, the value N will be based on the number of erasure blocks 152 in a given GCU 154, although this is not necessarily required. For the present example, it is contemplated that N=32 although other numbers of elements can be used. As shown in FIG. 5, the parity set 180 will have N−1 code words 176 (e.g., N−1=31) plus an appended parity value 182. Each of the various code words 176 and the associated parity value 182 are written as a different page of data in the GCU. More particularly, the code words and parity values for a given parity data set may be written to the same page and same designated erasure block (e.g., EB 0) across the respective dies, as shown.

Figure 6:
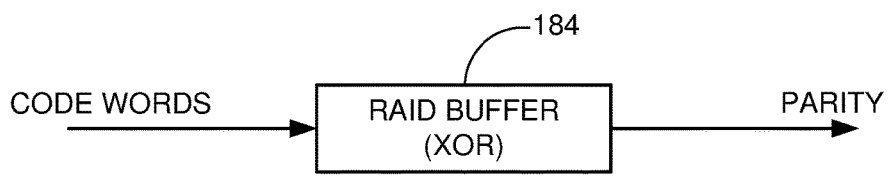
FIG. 6 shows the use of a buffer to generate the parity value in FIG. 5 in accordance with some embodiments.

The parity value 182 represents outer code and can take any number of forms. Without limitation, in one embodiment the parity value 182 represents the output of an exclusive-or (XOR) function applied to the N−1 code words 176. FIG. 6 shows a RAID buffer 184 configured to receive and accumulate the 31 code words 176 in each parity set 180 to generate the parity value 182. In this way, the data from the parity set can be reconstructed even in the event of a single die failure. It follows that nominally 16 KB of parity data protects (16 KB)(31)=496 KB of user data in each parity set, for an overhead ratio of about 3.2%.

The parity sets stored by the SSD 110 are managed using metadata. The metadata provide map structures to track the locations of various data blocks (e.g., MUs 170) to enable the SSD 110 to locate the physical location of existing data within the flash memory 142. During the servicing of a read command, it is generally necessary to locate the physical address within the flash memory 142 at which the most current version of a requested block (e.g., LBA) is stored, so that the controller can schedule and execute a read operation to return the requested data to the host.

During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 7:
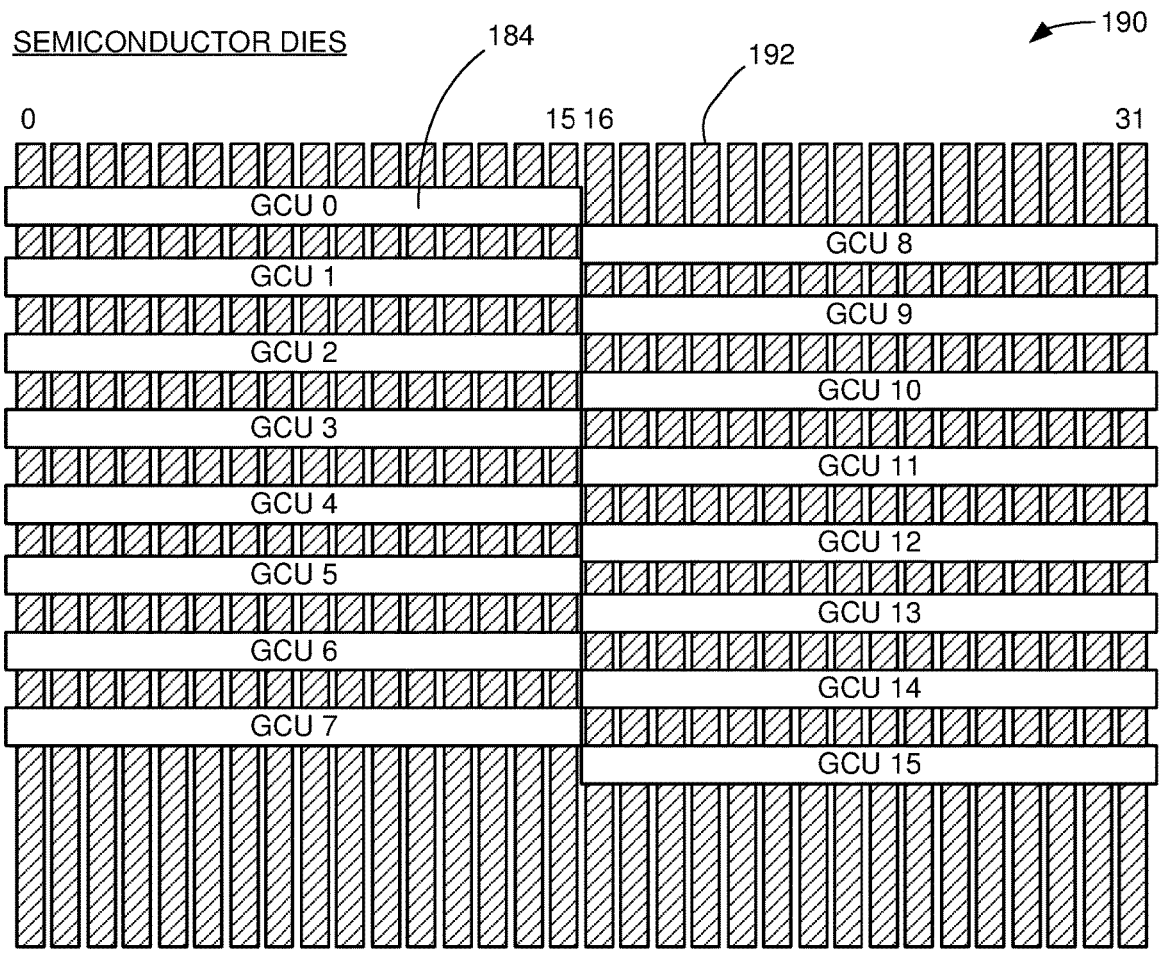
FIG. 7 shows a first example arrangement of garbage collection units (GCUs) in the flash memory of the SSD in some embodiments.

FIG. 7 illustrates a die set 190 arranged in accordance with some embodiments. The die set 190 includes a total of 32 dies 192 logically denoted from Die 0 to Die 31. The dies 192 generally correspond to the dies 144 discussed above.

A number of GCUs are denoted at 194. The GCUs are logically denoted from GCU 0 to GCU 15, and generally correspond to the GCUs 154 discussed above. Any number of GCUs can be used within the die set 190. In this simplified example, each GCU 194 is made up of 32 erasure blocks (e.g., 152, FIG. 3), with two erasure blocks taken from each die 192 (one erasure block per plane). Thus, each GCU spans a total of 16 dies. This is merely for purposes of providing a concrete illustration as other numbers and arrangements can be used as desired.

It can be seen that the GCUs are arranged such that GCUs 0 through 7 span Dies 0 through 15, and GCUs 8 through 15 span Dies 16 through 31. Assuming that the dies 0 through 15 are on a first channel and dies 16 through 31 are on a different, second channel (see e.g., FIG. 4), the arrangement of FIG. 7 is likely to provide a bi-modal transfer rate response as graphically illustrated in FIG. 8.

Figure 8:
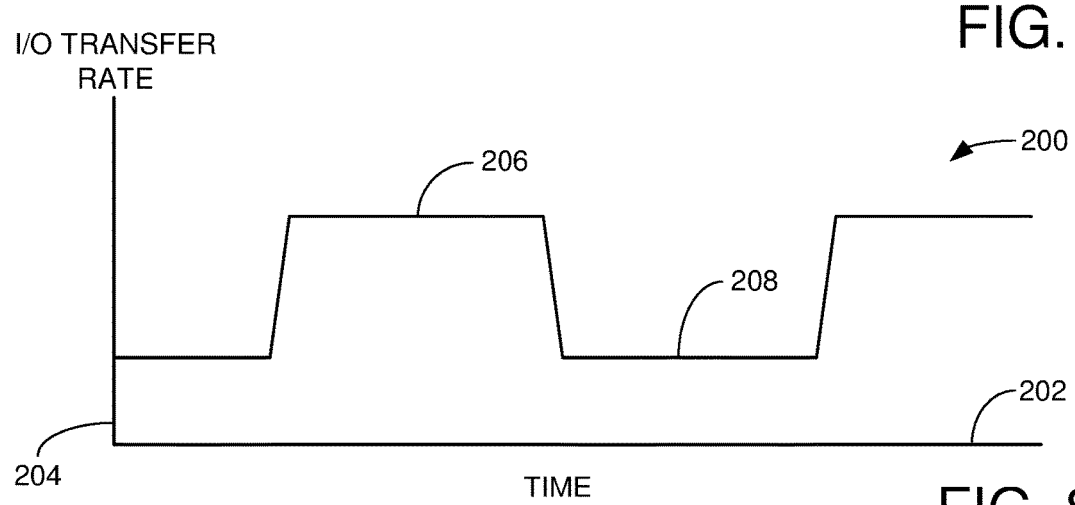
FIG. 8 is a graphical representation of I/O performance obtained using the arrangement of FIG. 7.

More particularly, FIG. 8 shows a data transfer curve 200 plotted against an elapsed time x-axis 202 and a transfer rate magnitude y-axis 204. The curve 200 has two primary transfer rates: a higher rate such as at section 206 and a lower rate such as at section 208.

The reason for this bi-modal response relates to the arrangement of the GCUs 194 in FIG. 7. Assuming a random distribution of reads and writes, roughly half (50%) of the time a command will need to wait for the completion of a preceding command. For example, if the associated set controller is servicing a read command from GCU 0, it is generally not possible for another command to be serviced using GCU 1 until the command from GCU 0 is completed. However, it would be generally possible to service a command involving any of the GCUs 8 through 15 during the servicing of the command for GCU 0.

It is recognized that SSDs such as 110 may employ sophisticated command processing to schedule various commands and promote or delay the commands in the command queue until the required resources are available. Nevertheless, even if such techniques are used the arrangement of the GCUs as in FIG. 7 will tend to provide data transfer rates that vary over time as generally represented in FIG. 8.

Figure 9:
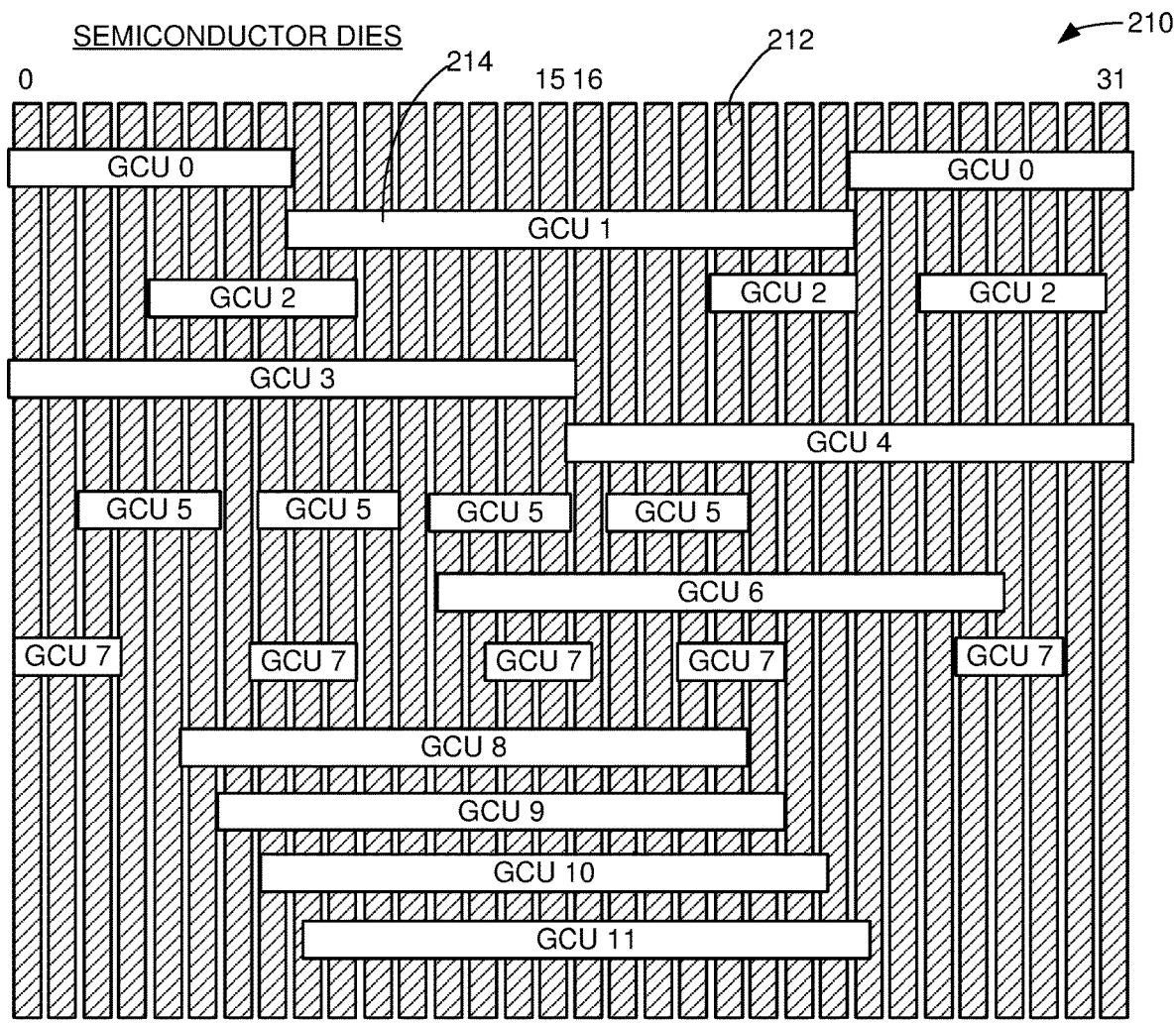
FIG. 9 shows a second example arrangement of GCUs in the flash memory of the SSD in further embodiments.

FIG. 9 shows another die set 210 generally similar to the die set 190 in FIG. 7. The die set 210 includes 32 dies 212 (Die 0 to Die 31) and various GCUs 214 (GCU 0 to GCU 11). As before, any respective numbers of dies and GCUs can be formed so this is merely for illustration and is not limiting.

The GCUs 214 in FIG. 9 are staggered GCUs such that each GCU uses a different combination of the dies. For example, GCU 0 is shown to span Dies 0-7 and 24-31; GCU 1 spans Dies 8-23; GCU 2 spans Dies 4-9, 20-23 and 26-30, and so on. Some of the GCUs are split into discontinuous groups of dies, such as GCUs 5 and 7. Other GCUs such as GCUs 8 through 11, are each incremented by one die (e.g., GCU 8 uses dies 5-20, GCU 9 uses Dies 6-21, etc.). In this latter case, GCU 8 is formed using a first subset of the dies, and each of the succession of additional GCUs 9-11 are formed by removing a die from the first subset of dies and adding a die to the first subset of dies. Other subsets of dies can be used as desired.

Generally, the respective staggered GCUs 214 are selected such that each GCU uses a different subset (combination) of dies 212, and each die nominally supports the same percentage of the overall GCUs. In a system such as FIG. 9 where there are N dies and each GCU occupies M dies where M is less than N, then on average each die will tend to support M/N of the GCUs. It is contemplated that at least some of the GCUs may use different combinations of the channels as well (see e.g., FIG. 4). For example, a first GCU may use a first channel but not a second channel, a second GCU may use both the first and second channels, and a third GCU may use the second channel but not the first channel.

Figure 10:
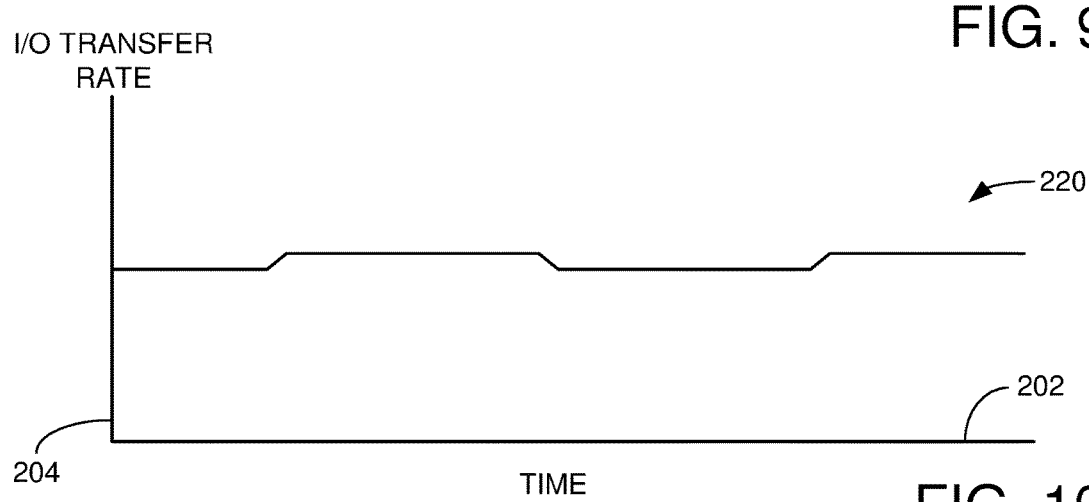
FIG. 10 is a graphical representation of I/O performance obtained using the arrangement of FIG. 9.

The staggered nature of the GCUs 214 will tend to provide more consistent data I/O transfer rate performance, as indicated by transfer rate curve 220 in FIG. 10. It is contemplated that there will still be opportunities for multiple commands to be concurrently executed (see e.g., GCUs 0 and 1, GCUs 3 and 4), but more typically, commands will tend to require a consistent amount of time to complete. Other advantages of the staggered scheme include better distribution of wear, better utilization of the various system resources, etc. The use of staggered GCUs also allows GCUs to accommodate non-standard sizes (such as less than 32 erasure blocks per GCU) due to die failures or other conditions.

In embodiments where the SSD 110 is configured in accordance with the NVMe specification, each NVM set (see e.g., FIG. 4) can be provided with a unique set of staggered GCUs. The system may tailor the GCUs in each set for the requirements of the associated owner, so that each NVM set has GCUs formed from different combinations of the available dies in that set.

Figure 11:
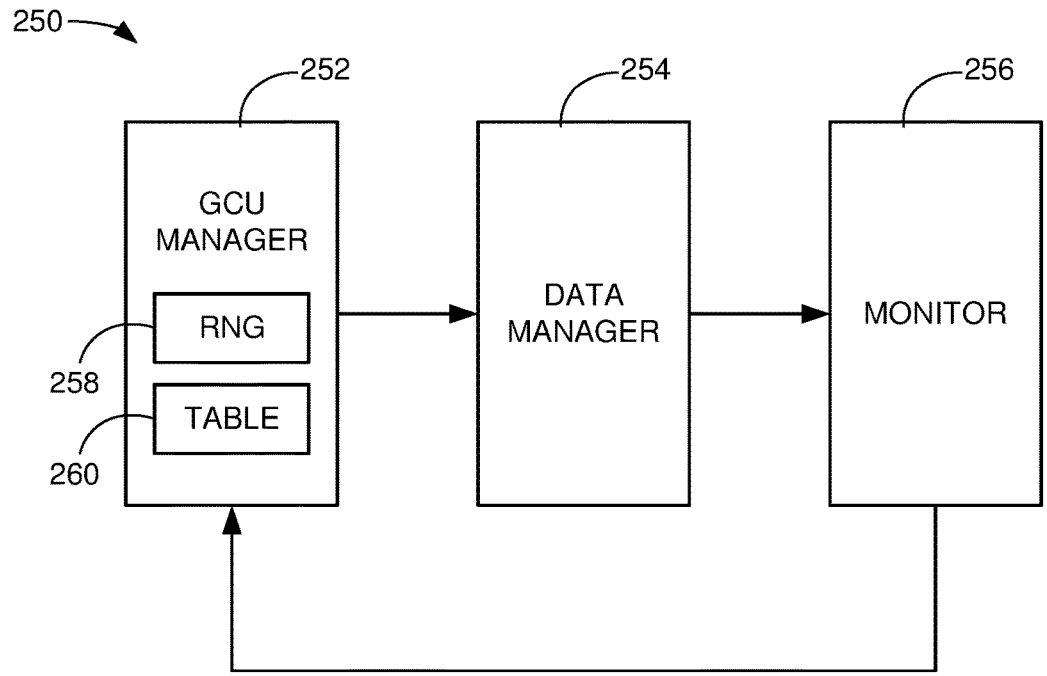
FIG. 11 shows a management system of the SSD in some embodiments.

FIG. 11 is a functional block representation of a memory management system 250 constructed and operated in accordance with some embodiments. The system 250 may form a portion of the controller circuit 112 of the SSD 110 (see FIG. 2), and may be realized using hardware circuits and/or programmable processor circuits as desired.

The system 250 includes a GCU manager circuit 252, a data manager circuit 254 and a monitor circuit 256. The GCU manager 252 operates to selectively form the various staggered GCUs as shown in FIG. 9 for a given die set.

The manager 252 may include various subsystems such as a random number generator (RNG) 258 and a table 260 to store the various configurations of the GCUs. The RNG 258 may enable the various GCUs to be selected randomly to ensure even distribution of the GCUs among the various dies. The table 260 provides a data structure in a memory to record and, as required, show changes made to the GCU configuration over time.

Once the manager 252 establishes the configuration of the staggered GCUs, the data manager 254 operates to service various host access commands to write data to and read data from the GCUs. Generally, the data manager will carry out three (3) primary operations: (1) hot data transfers where user data sets are transferred between the associated host and the die set in response to host access (e.g., read/write) commands; (2) cold data transfers, which represent background migrations of data to different locations within the die sets such as during garbage collection; and (3) map updates where map metadata is journaled or otherwise transferred to the NVM for storage. It will be appreciated that these various operations are carried out by the data manager 254 in a manner designed to provide deterministic operation for each of the respective users.

The monitor circuit 256 generally monitors the effectiveness of the GCU groups. This can be carried out in a number of ways, including read/write parameters such as bit error rates, write times, PE counts, etc. In some cases, the monitor circuit may determine that certain combinations of the dies in the GCUs are providing suboptimum performance, in which case the monitor circuit may supply feedback to enable the GCU manager to adaptively reorder the various erasure block/die combinations. In this way, better overall system performance can be maintained.

Because of the adaptive nature of the GCU manager 252, die failures and other conditions can result in adjustments to the sizes and locations of the GCUs, including reducing the total number of blocks in a given GCU, migrating a portion of GCU from one die to another, etc. In some cases, a first GCU may include a particular die that is removed from this first GCU and migrated to a different, second GCU. Any number of different operations are contemplated to maintained desired levels of performance.

Figure 12:
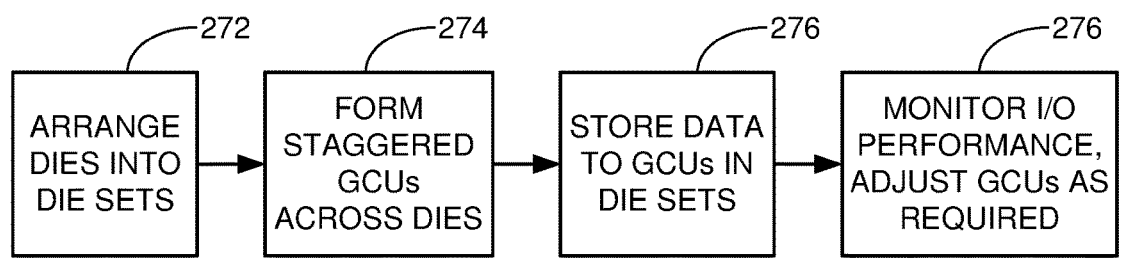
FIG. 12 is a sequence diagram showing operation of the system of FIG. 11 in some embodiments.

FIG. 12 shows a sequence diagram 270 to illustrate operation of the SSD 110 in some embodiments. The various steps may be carried out at appropriate times. At block 272, a group of semiconductor memory dies is arranged into one or more die sets. Staggered GCUs are formed at block 274 using memory units (e.g., erasure blocks) from different combinations of the dies in each set. Data sets are thereafter stored to the GCUs at block 276 in response to various host access commands. The GCUs are filled, garbage collected and returned to service as required.

Block 278 shows the monitoring of the performance of the GCUs during block 276 and, as required, adjustments to the various GCUs such that the GCUs are spanned across different combinations of the semiconductor dies.

It will now be appreciated that the various embodiments present a number of benefits over the art. Providing a GCU manager circuit to manage the distribution of various GCUs across multiple dies in a die set can ensure enhanced and consistent performance across all of the sets.

While not necessarily required, the use of separate and distinct map portions for each of a number of different sets can enable more efficient management of the metadata used to control data transfers with each set while maintaining deterministic performance of the SSD or other data storage device. While the various embodiments have been described in terms of an SSD in an NVMe environment, other types of storage devices and operational environments can be used as desired. Flash memory is a particularly suitable NVM, but other forms of data storage memory can be used.

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A data storage device, comprising:
   a non-volatile memory (NVM) comprising a total number K semiconductor memory dies coupled to a total number L channels so that subgroups of M semiconductor memory dies are arranged as die groups, each die group interconnected to a different one the channels, where K, L, M are integers, K>L, and K>M;
   a garbage collection unit (GCU) manager circuit configured to form a group of garbage collection units (GCUs) each independently erasable and allocatable for storage of user data, each GCU comprising a total number N erasure blocks, the erasure blocks in each GCU taken from a different combination of the K semiconductor memory dies and the L channels, each erasure block representing a smallest unit of memory that can be erased as a unit; and
   a data manager circuit configured to transfer data between the GCUs and at least one host device responsive to host access commands from the at least one host device.

2. The data storage device of claim 1, wherein K=256, L=8, M=32, and N=32.

3. The data storage device of claim 1, wherein the data manager circuit arranges the data transferred to the GCUs as parity data sets each comprising N−1 pages of code words comprising user data bits and error correcting code bits, plus an Nth page of parity data determined by combining the N−1 pages of code words using a selected combinatorial function.

4. The data storage device of claim 3, wherein the error correcting code bits are low density parity check (LDPC) code bits, and wherein the data storage device further comprises an LDPC decoder which uses the LDPC code bits to resolve bit errors in the user data bits retrieved from the NVM during a read operation.

5. The data storage device of claim 1, wherein each die has at least two planes that support simultaneous access commands to respective erasure blocks in the respective planes at a common address, and wherein at least one erasure block from each plane in a selected die is incorporated into each GCU that includes the selected die.

6. The data storage device of claim 1, wherein the GCU manager circuit comprises a random number generator that generates a random number, and wherein the GCU manager circuit uses the random number to assign the respective dies to the respective GCUs.

7. The data storage device of claim 1, wherein the data manager circuit further operates to monitor data transfer rate performance between the GCUs and a host device, and to reorder the GCUs responsive to the monitored data transfer rate performance.

8. The data storage device of claim 1, wherein the NVM is a flash memory of a solid-state drive (SSD), wherein the plurality of channels interconnect the dies with a controller circuit and comprise at least first, second and third channels, and wherein at least a first GCU uses the first channel without using the second and third channels, a second GCU uses the second channel without using the first channel, and a third GCU uses both the first and second channels.

9. The data storage device of claim 1, wherein a first GCU is formed from a first subset of the dies, and each of a succession of additional GCUs is formed by removing a die from the first subset of dies and adding a die to the first subset of dies.

10. The data storage device of claim 1, wherein a first GCU uses a first total number of the L channels, and a second GCU uses a different second total number of the L channels.

11. The data storage device of claim 1, wherein a first GCU uses a first total number of the die groups, and a second GCU uses a different second total number of the die groups.

12. The data storage device of claim 1, characterized as a solid-state drive (SSD) configured in accordance with the NVMe (Non-Volatile Memory Express) specification, the SSD further comprising a control circuit configured to divide the dies into different groups to form die sets each configured to store user data associated with a different user.

13. A method for storing data to a non-volatile memory (NVM) comprising a total number K semiconductor memory dies coupled to a total number L channels so that subgroups of M semiconductor memory dies are arranged as die groups, each die group interconnected to a different one the channels, where K, L, M are integers, K>L, and K>M, the method comprising:
   generating a group of garbage collection units (GCUs) each independently erasable and allocatable for storage of user data, each GCU comprising a total number N erasure blocks, the erasure blocks in each GCU taken from a different combination of the K semiconductor memory dies and the L channels, each erasure block representing a smallest unit of memory that can be erased as a unit; and
   storing data sets to the individual GCUs responsive to host commands.

14. The method of claim 13, wherein K=256, L=8, M=32, and N=32.

15. The method of claim 13, wherein the storing data sets comprises arranging each data set as a parity data set comprising N−1 pages of code words comprising user data bits and error correcting code bits, plus an Nth page of parity data determined by combining the N−1 pages of code words using a selected combinatorial function.

16. The method of claim 15, wherein the error correcting code bits are low density parity check (LDPC) code bits, and wherein the method further comprises using an LDPC decoder which uses the LDPC code bits to resolve bit errors in the user data bits retrieved from the NVM during a read operation.

17. The method of claim 13, further comprising generating a random number, and using the random number to select different combinations of the dies and the channels to form each of the GCUs.

18. The method of claim 13, wherein each die has at least two planes that support simultaneous access commands to respective erasure blocks in the respective planes at a common address, and wherein at least one erasure block from each plane in a selected die is incorporated into each GCU that includes the selected die.

19. The method of claim 13, further comprising operating the NVM in accordance with the Non-Volatile Memory Express (NVMe) Standard so that the NVM is divided among different NVM sets accessible by different users.

20. The method of claim 13, wherein the NVM is a flash memory of a solid-state drive (SSD), wherein the plurality of channels interconnect the dies with a controller circuit and comprise at least first, second and third channels, and wherein at least a first GCU uses the first channel without using the second and third channels, a second GCU uses the second channel without using the first channel, and a third GCU uses both the first and second channels.

* * * * *